(12) United States Patent
Kim et al.

(10) Patent No.: US 12,408,364 B2
(45) Date of Patent: Sep. 2, 2025

(54) HOLE DRAINING STRUCTURE FOR SUPPRESSION OF HOLE ACCUMULATION

(71) Applicant: Infineon Technologies Austria AG, Villach (AT)

(72) Inventors: Hyeongnam Kim, Chandler, AZ (US); Mohamed Imam, Chandler, AZ (US)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 275 days.

(21) Appl. No.: 17/308,854

(22) Filed: May 5, 2021

(65) Prior Publication Data

US 2022/0359739 A1 Nov. 10, 2022

(51) Int. Cl.
| | |
|---|---|
| *H10D 30/47* | (2025.01) |
| *H10D 62/815* | (2025.01) |
| *H10D 62/824* | (2025.01) |
| *H10D 62/85* | (2025.01) |

(52) U.S. Cl.
CPC ..... *H10D 30/4738* (2025.01); *H10D 62/8164* (2025.01); *H10D 62/824* (2025.01); *H10D 62/8503* (2025.01)

(58) Field of Classification Search
CPC ............... H01L 29/7785; H01L 29/155; H01L 29/2003; H01L 29/205; H01L 21/0251; H01L 21/02458; H01L 21/02507
See application file for complete search history.

(56) References Cited

U.S. PATENT DOCUMENTS

| | | | |
|---|---|---|---|
| 9,577,048 B1* | 2/2017 | Yang | H01L 21/28581 |
| 11,508,818 B2* | 11/2022 | Hsu | H01L 29/151 |
| 2014/0209862 A1* | 7/2014 | Ikuta | H01L 21/0254 |
| | | | 257/190 |
| 2018/0166565 A1* | 6/2018 | Chen | H01L 29/1066 |

FOREIGN PATENT DOCUMENTS

CN 209199940 U 8/2019

OTHER PUBLICATIONS

Saichiro Kaneko, et al., "Current-collapse-free Operations up to 850 V by GaN-GIT utilizing Hole Injection from Drain", 2013 25th International Symposium on Power Semiconductor Devices & IC'S (ISPSD), IEEE, May 10, 2015, pp. 41-44.
International Search Report and Written Opinion corresponding to International Application No. PCT/EP2022/062040, dated Sep. 6, 2022, 22 pages.

* cited by examiner

*Primary Examiner* — Jay C Kim
*Assistant Examiner* — Woo K Lee
(74) *Attorney, Agent, or Firm* — Murphy, Bilak & Homiller, PLLC

(57) ABSTRACT

One or more semiconductor structures comprising a hole draining structure are provided. A semiconductor structure has a first layer formed over a substrate. The first layer has a first concentration of a metal material. The semiconductor structure has a second layer formed over the first layer. The second layer has a second concentration of the metal material different than the first concentration of the metal material. The semiconductor structure has a hole draining structure formed from a superlattice formed between the first layer and the second layer. The hole draining structure has a concentration of the metal material increasing towards the first layer and decreasing towards the second layer.

5 Claims, 5 Drawing Sheets

HOLE DRAINING STRUCTURE FOR SUPPRESSION OF HOLE ACCUMULATION

TECHNICAL FIELD

The present disclosure relates to the field of semiconductor structures.

BACKGROUND

A semiconductor structure generally comprises one or more layers formed in and/or on a substrate. The semiconductor structure may comprise a source, a gate, and a drain. The gate can be used control current flow through a channel between the source and the drain. When the semiconductor structure is turned on such as by applying a voltage to the gate, then the channel may allow electrons to flow between the source and the drain. When the semiconductor structure is turned off, then the flow of electronics through the channel may cease.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, a semiconductor structure is provided. The semiconductor structure may include a first layer formed over a substrate of the semiconductor structure. The first layer comprises a first concentration of a metal material. In some embodiments, the metal material comprises at least one of Al, Ga, or a combination of Al and Ga. In some embodiments, the first layer may comprise AlN, AlGaN, or a combination thereof. The semiconductor structure may include a second layer formed over the first layer. The second layer comprises a second concentration of the metal material different than the first concentration of the metal material. The semiconductor structure may include a hole draining structure formed from a superlattice formed between the first layer and the second layer. The hole draining structure comprises a concentration of the metal material increasing towards the first layer and decreasing towards the second layer.

According to some embodiments, a semiconductor structure is provided. The semiconductor structure may include a first layer formed over a substrate of the semiconductor structure. The first layer comprises a first concentration of a metal material. The semiconductor structure may include a second layer formed over the first layer. The second layer comprises a second concentration of the metal material less than the first concentration of the metal material. The semiconductor structure may include a superlattice formed between the first layer and the second layer. A first portion of the superlattice comprises a hole draining structure formed over a second portion of the superlattice. The hole draining structure comprises a first plurality of layers comprising increasing concentrations of the metal material towards the first layer and decreasing concentrations of the metal material towards the second layer.

According to some embodiments, a semiconductor structure is provided. The semiconductor structure may include a first layer formed over a substrate of the semiconductor structure. The first layer comprises a first concentration of a metal material. The semiconductor structure may include a second layer formed over the first layer. The second layer comprises a second concentration of the metal material less than the first concentration of the metal material. The semiconductor structure may include a superlattice formed between the first layer and the second layer. The superlattice comprises a hole draining structure comprising a first plurality of layers comprising increasing concentrations of the metal material towards the first layer and decreasing concentrations of the metal material towards the second layer.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
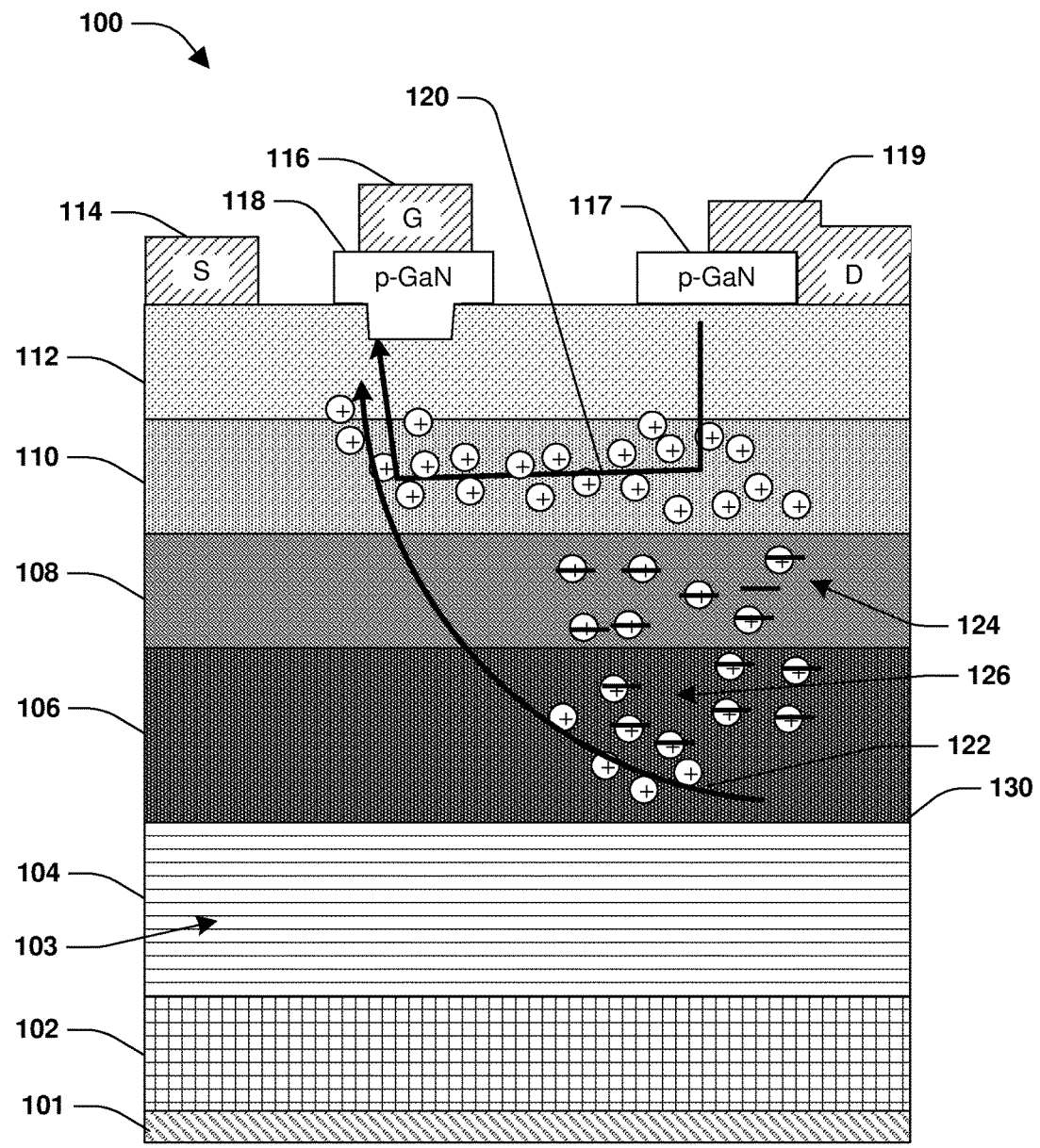
FIG. 1 is an illustration of a semiconductor structure experiencing hole accumulation.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and device structures are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

The term "over" and/or "overlying" and/or the like is not to be construed as meaning only "directly over" and/or "having direct contact with". Rather, if one element is "over" and/or "overlying" another element (e.g., a region is overlying another region), a further element (e.g., a further region) may be positioned between the two elements (e.g., a further region may be positioned between a first region and a second region if the first region is "over" and/or "overlying" the second region). Further, if a first element is "over" and/or "overlying" a second element, at least some of the first element may be vertically coincident with the second element, such that a vertical line may intersect the first element and the second element.

The semiconductor substrate or body may extend along a main extension plane. The term "horizontal" and/or the like as used herein intends to describe an orientation substantially parallel to said main extension plane. A first or main horizontal side of the semiconductor substrate or body may run substantially parallel to horizontal directions or may have surface sections that enclose an angle of at most 8° (or at most 6°) with the main extension plane. The first or main horizontal side can be for instance the surface of a wafer or a die. Sometimes, the horizontal direction is also referred to as lateral direction.

The term "vertical" as used herein intends to describe an orientation which is substantially arranged perpendicular to the horizontal direction, (e.g., parallel to the normal direction of the first side of the semiconductor substrate or body or parallel to the normal direction of a surface section of the first side of the semiconductor substrate or body).

A semiconductor structure comprises a source, a drain, and a gate. Application of a voltage to the gate generally controls electrical current flow through a channel between the source and the drain. During switching of the semiconductor structure, the gate may be switched from an off state to an on state to allow current flow through the channel or may be switched from the on state to the off state to stop the flow of current through the channel. The semiconductor structure may suffer dynamic effects during switching, which can result in performance degradation of the semiconductor structure. In some embodiments where the semiconductor structure comprises a gallium nitride (GaN) transistor, the dynamic effects can affect an on-state resistance (Rdson), such as an increase in the Rdson that can result in power loss that decreases the overall efficiency of the GaN transistor. In some embodiments, a drain p-type gallium nitride (p-GaN) structure may be used to suppress the Rdson increase to improve the switching lifetime of the GaN transistor and reduce performance degradation otherwise occurring from the dynamic effects. Unfortunately, the drain p-GaN structure will inject a dense amount of holes into the semiconductor structure. Many of these holes will accumulate by the gate of the semiconductor structure. This hole accumulation can change an electrical field generated when a voltage is applied to the gate, which change the operational dynamics of the semiconductor structure that could lead to early device failure. The accumulation of the holes near the gate can lower a source-to-drain barrier, and thus increase a GaN-channel-to-gate vertical electric field. The decrease in the source-to-drain barrier height and/or the increase in the GaN-channel-to-gate vertical electric field can result in punch-through and/or gate breakdown.

The holes may accumulate at an interface between two layers of the semiconductor structure as opposed to being able to travel down towards the substrate and away from the gate. Some of these accumulated holes may travel towards the gate and accumulate near the gate. The hole accumulation at the interface between the two layers may be a result of a large valence band discontinuity between the two layers. The large valence band discontinuity corresponds to a high valence band offset at the interface between the two layers (e.g., a valence band offset of about 287 meV). The high valence band offset at the interface between the two layers hinders/impedes the holes from flowing from one of the layers into the other layer, and thus the holes accumulate in one of the layers and do not travel into the other layer towards the substrate and away from the gate.

The high valence band offset is caused by the two layers having differing amounts of metal material, such as aluminum. In some embodiments, a first layer, such as a superlattice, formed over a substrate of the semiconductor structure may comprise first amount of metal material (e.g., between about 30% to about 38% aluminum or any other amount of metal material). A second layer, such as a p-type AlGaN layer, formed over the first layer and between the channel and the first layer may comprise a second amount of the metal material (e.g., between about 2% to about 5% aluminum or any other amount of metal material) that is less than the first amount of metal material of the first layer. In some embodiments, the p-type AlGaN layer comprises a high density of p-type dopant (e.g., carbon, Fe, Mg, etc.). The higher percentage concentration of metal material in a layer, the larger a bandgap of that layer. Thus, the first layer has a much larger bandgap than the second layer. The differing bandgaps between the first layer and the second layer due to the differing amounts of metal material within the first layer and the second layer causes the high valence band offset at the interface between the first layer and the second layer, thus resulting in the large valence band discontinuity. The large valence band discontinuity inhibits the holes from traveling down from the second layer into the first layer and towards the substrate. Instead, the holes accumulate at the second layer near the interface between the second layer and the first layer (e.g., at an interface between the p-type AlGaN layer and the superlattice) because of the large valence band discontinuity. Some of these accumulated holes will then drift towards the gate and accumulate at the gate, which can lead to early failure of the semiconductor device such as due to punch-through and/or gate breakdown.

Accordingly, as provided herein, a hole draining structure is provided for the semiconductor structure to mitigate hole accumulation within the semiconductor structure. In some embodiments, the semiconductor structure comprises a plurality of layers that may have differing concentrations of metal material such as aluminum. If the difference in concentrations of metal material in two adjacent layers is large and causes a large valence band offset at an interface between the two adjacent layers (e.g., a 287 emV valence band offset if one layer has a 3% concentration of aluminum and the other layer has a 34% concentration of aluminum), then holes will accumulate at the interface between the two adjacent layers.

To mitigate the accumulation of the holes, the hole draining structure is formed with one or more layers of varying amounts of metal material or with a gradient of metal material, which provide a hole draining path through which the holes can travel down through the plurality of layers of the semiconductor structure to the substrate and away from the gate. Thus, instead of the interface between the two adjacent layers, such as an interface between the first layer (e.g., a superlattice with average 34% aluminum) and the second layer (e.g., a p-type AlGaN layer with 3% aluminum), having the large valence band discontinuity due to the large difference in concentrations of metal material, the hole draining structure is formed at the interface in order to provide a less abrupt change in metal material concentrations. This results in smaller valence band offsets at interfaces between the first layer and the hole draining structure and between the second layer and the hole draining structure. In some embodiments, the valence band offsets are reduced from about 287 meV to about 47.8 meV and about 63.5 meV at the interfaces between the hole draining structure and the first layer and second layer. Reducing the valence band offsets will reduce any valence band discontinuity that would otherwise impede/hinder the holes from traveling from the second layer into the first layer and towards the substrate away from the gate.

In some embodiments, the hole draining structure is formed from at least a portion of the second layer (e.g., one or more layers of the superlattice may comprise increasing concentrations of metal material) or the entire second layer (e.g., the entire superlattice may be graded with metal material or comprise a gradient of metal material). In some embodiments, the hole draining structure may comprise a graded concentration of the metal material with increasing concentrations in layers closer to the substrate and decreasing concentrations in layers closer to the second layer such as the p-type AlGaN layer. In some embodiments, the hole draining structure comprises a plurality of layers where some of the layers closer to the first layer have smaller concentrations of the metal material than some of the layers closer to the substrate. In this way, a portion of the hole draining structure closer to the first layer has a similar metal material concentration as the first layer, and a portion of the hole draining structure closer to a layer below the hole draining structure has a similar metal material concentration as that layer (e.g., that layer being the superlattice if the hole draining structure is formed over the superlattice; that layer being a bottom portion of the superlattice underneath a top portion of the superlattice used to form the hole draining structure; or that layer being a layer below the superlattice if the entire superlattice is formed as the hole draining structure). Because there is not abrupt change in metal material concentration between the layers, there is not abrupt or large valence band discontinuity that would otherwise hinder the flow of holes amongst the layers towards the substrate and away from the gate.

Providing the hole draining path suppresses the holes from accumulating around the two adjacent layers and then traveling towards a gate of the semiconductor structure. Instead, the hole draining path provides a path through which the holes can travel through the hole draining path away from the gate and/or layers above the hole draining structure. Draining the holes down towards the substrate so that the holes do not drift to the gate and accumulate near the gate will increase the operational lifespan of the semiconductor device. Otherwise, without the hole draining structure, the holes can accumulate near the gate, which changes the electric field near the gate that can lead to device failure and a shorted operational lifespan of the semiconductor structure According to some embodiments, a semiconductor structure is provided. The semiconductor structure may include a first layer formed over a substrate, wherein the first layer comprises a first concentration of a metal material; a second layer formed over the first layer, wherein the second layer comprises a second concentration of the metal material different than the first concentration of the metal material; and a hole draining structure formed from a superlattice formed between the first layer and the second layer, wherein the hole draining structure comprises a concentration of the metal material increasing towards the first layer and decreasing towards the second layer.

According to some embodiments, the first concentration of the metal material is greater than the second concentration of the metal material.

According to some embodiments, the hole draining structure comprises a third concentration of the metal material at a first interface between the hole draining structure and the first layer, wherein the third concentration of the metal material is greater than the second concentration of the metal material and less than the first concentration of the metal material.

According to some embodiments, the hole draining structure comprises a fourth concentration of the metal material at a second interface between the hole draining structure and the second layer, wherein the fourth concentration of the metal material is greater than the second concentration of the metal material, less than the first concentration of the metal material, and less than the third concentration of the metal material.

According to some embodiments, the hole draining structure comprises a graded concentration of the metal material to provide a hole draining path to drain holes, injected into the semiconductor structure, towards the substrate.

According to some embodiments, the hole draining path drains the holes away from a gate of the semiconductor structure.

According to some embodiments, the second layer comprises aluminum gallium nitride, the metal material comprises aluminum, and the semiconductor structure comprises a gallium nitride channel.

According to some embodiments, the semiconductor structure comprises a p-gallium nitride structure, wherein the hole draining structure provides a hole draining path to drain holes, injected by the p-gallium nitride structure, towards the substrate.

According to some embodiments, a semiconductor structure is provided. The semiconductor structure may include a first layer formed over a substrate, wherein the first layer comprises a first concentration of a metal material; a second layer formed over the first layer, wherein the second layer comprises a second concentration of the metal material less than the first concentration of the metal material; and a superlattice formed between the first layer and the second layer, wherein a first portion of the superlattice comprises a hole draining structure formed over a second portion of the superlattice, and wherein the hole draining structure comprises a first plurality of layers comprising increasing concentrations of the metal material towards the first layer and decreasing concentrations of the metal material towards the second layer.

According to some embodiments, the hole draining structure comprises a second plurality of layers excluding a metal material, such as aluminum.

According to some embodiments, the first plurality of layers are interleaved with the second plurality of layers.

Accordingly to some embodiments, the hole draining structure compromises a second plurality of layers, wherein a layer of the second plurality of layers excludes a metal material, such as aluminum, and one or more other layers of the second plurality of layers comprise increasing concentrations of the metal material towards the first layer and decreasing concentrations of the metal material towards the second layer.

According to some embodiments, the first plurality of layers are interleaved with the second plurality of layers.

According to some embodiments, the metal material comprises aluminum.

According to some embodiments, a semiconductor structure is provided. The semiconductor structure may include a first layer formed over a substrate, wherein the first layer comprises a first concentration of a metal material; a second layer formed over the first layer, wherein the second layer comprises a second concentration of the metal material less than the first concentration of the metal material; and a superlattice formed between the first layer and the second layer, wherein the superlattice comprises a hole draining structure comprising a first plurality of layers comprising increasing concentrations of the metal material towards the first layer and decreasing concentrations of the metal material towards the second layer.

According to some embodiments, the superlattice comprises a second plurality of layers excluding a metal material, such as aluminum.

According to some embodiments, the first plurality of layers are interleaved with the second plurality of layers.

According to some embodiments, the superlattice comprises a second plurality of layers, wherein a layer of the second plurality of layers excludes a metal material, such as aluminum, and one or more other layers of the second plurality of layers comprise increasing concentrations of the metal material towards the first layer and decreasing concentrations of the metal material towards the second layer.

According to some embodiments, the first plurality of layers are interleaved with the second plurality of layers.

According to some embodiments, a first set of layers of the first plurality of layers comprises a third concentration of the metal material and a second set of layers of the first plurality of layers comprises a fourth concentration of the metal material greater than the third concentration of the metal material.

FIG. 1 illustrates a semiconductor structure 100 experiencing hole accumulation. The semiconductor structure 100 comprises one or more layers formed over a substrate 101. In some embodiments, the substrate 101 comprises a silicon (Si) substrate, a sapphire substrate, a silicon carbide (SiC) substrate, a gallium nitride (GaN) substrate, or any other material substrate. A first layer 102 may be disposed over the substrate 101. In some embodiments, the first layer 102 comprises a transition layer and/or a nucleation layer. In some embodiments, the transition layer comprises an aluminum gallium nitride material (Al—GaN) with between about 35% to about 60% metal content and has a height between about 50 nm to about 300 nm. In some embodiments, the transition layer is deposed over the nucleation layer. In some embodiments, the nucleation layer comprises an aluminum nitride (AlN) material and has a height between about 10 nm to about 300 nm.

A second layer 104 may be disposed over the first layer 102. In some embodiments, the second layer 104 comprises a superlattice 103. In some embodiments, the superlattice 103 comprises a periodic structure of layers of two or more materials (e.g., a first layer of a first material, a second layer of a second material, a third layer of the first material, a fourth layer of the second material, a fifth layer of the first material, etc.). The superlattice 103 may comprise a first set of layers having a first material type and a second set of layers having a second material type, where the first set of layers is interleaved with the second set of layers. In some embodiments, the first set of layers comprises an aluminum gallium nitride (AlGaN) material having between about 10% to about 20% metal content and each layer of the first set of layers may have a height between about 10 nm to about 20 nm. In some embodiments, the second set of layers comprises aluminum nitride (AlN) and each layer of the second set of layers has a height between about 4 nm to about 10 nm. In some embodiment, a loop of the superlattice 103 comprises one layer of the first set of layers and one layer of the second set of layers, and the superlattice 103 may comprise between about 50 loops to about 100 loops. In some embodiments, the superlattice 103 has an effective percentage of metal material between about 30% and about 38%, such as 34%.

A third layer 106 may be disposed over the second layer 104. In some embodiments, the third layer 106 is a p-type AlGaN layer having a height between about 700 nm to about 2,000 nm and having a metal concentration between about 3% to about 20%. In some embodiments, the p-type AlGaN layer comprises a high density of p-type dopant (e.g., carbon, Fe, Mg, etc.). A fourth layer 108 may be disposed over the third layer 106. In some embodiments, the fourth layer 108 is an AlGaN back barrier having a height between about 100 nm to about 500 nm and having a metal concentration between about 3% to about 10%. In some embodiments, the fourth layer 108 comprises a gallium nitride (GaN) layer. A channel 110 may be disposed over the fourth layer 108. In some embodiments, the channel 110 is a GaN channel having a height between about 80 nm to about 300 nm. In some embodiments, a relatively thick GaN layer, having a height between about 180 nm to about 800 nm, is used as the channel 100 and the fourth layer 108 as a back barrier layer. A fifth layer 112 may be disposed over the channel 110. In some embodiments, the fifth layer 112 is an AlGaN top barrier having a height between about 15 nm to about 80 nm and a metal concentration between about 15% to about 23%.

The semiconductor structure 100 comprises a source 114, a gate 116, and a drain 119 formed over the channel 110 to create a transistor, such as a GaN transistor. In some embodiments, the semiconductor structure 100 comprises a gate-pGaN 118 and a drain-pGaN 117. In some embodiments, the semiconductor structure 100 does not comprise the drain-pGaN 117, and thus the drain-pGaN 117 may be optional. The gate-pGaN 118 and the drain-pGaN 117 may be utilized to suppress dynamic effects that occur during switching of the transistor, such as to suppress an Rdson increase. Suppressing the Rdson increase will result in an improved switching lifetime of the transistor and reduce performance degradation otherwise occurring from the dynamic effects. During operation of the gate-pGaN 118 and the drain-pGaN 117, holes 126 are injected into the semiconductor structure 100. Even without the gate-pGaN 118 and the drain-pGaN 117, the holes 126 may be generated during operation of the semiconductor structure 100, and electrons 124 within the semiconductor structure 100 may interact with the holes 126 during the operation of the semiconductor structure 100.

Some of the holes 126 may drift towards the gate 116 along a leakage path 120 between the drain 119 and the gate 116. Some of the holes 126 may accumulate near an interface 130 between the second layer 104, such as the superlattice 103, and the third layer 106, such as the p-type AlGaN layer. The holes 126 may accumulate near this interface 130 because there is a large valence band discontinuity at the interface 130. The large valence band discontinuity is caused by an abrupt/large valence band offset at the interface 130 (e.g., a valence band offset of about 287 meV) due to a large difference in band gaps of the second layer 104 and the third layer 106. The large difference in band gaps of the second layer 104 and the third layer 106 is because of a large difference in metal material concentrations between the second layer 104 (e.g., the superlattice 103 with about 34% aluminum concentration) and the third layer 106 (e.g., the p-type AlGaN layer with about 3% aluminum concentration). This large valance band discontinuity causes some of the holes 126 to accumulate near the interface 130 between the second layer 104 and the third layer 106 because the abrupt/large valence band offset at the interface 130 impedes the holes 126 from traveling from the third layer 106, through the interface 130, and into the second layer 104. Some of these accumulated holes may travel along a path 122 towards the gate 116. The accumulation of the holes near the gate 116 can lead to premature failure of the semiconductor structure 100.

Accordingly, as provided herein, a hole draining structure is provided to suppress the holes 126 from accumulating and allow the holes 126 to drain towards the substrate 101 away from the gate 116. Some embodiments of the hole draining structure are illustrated by FIGS. 2-5.

Figure 2:
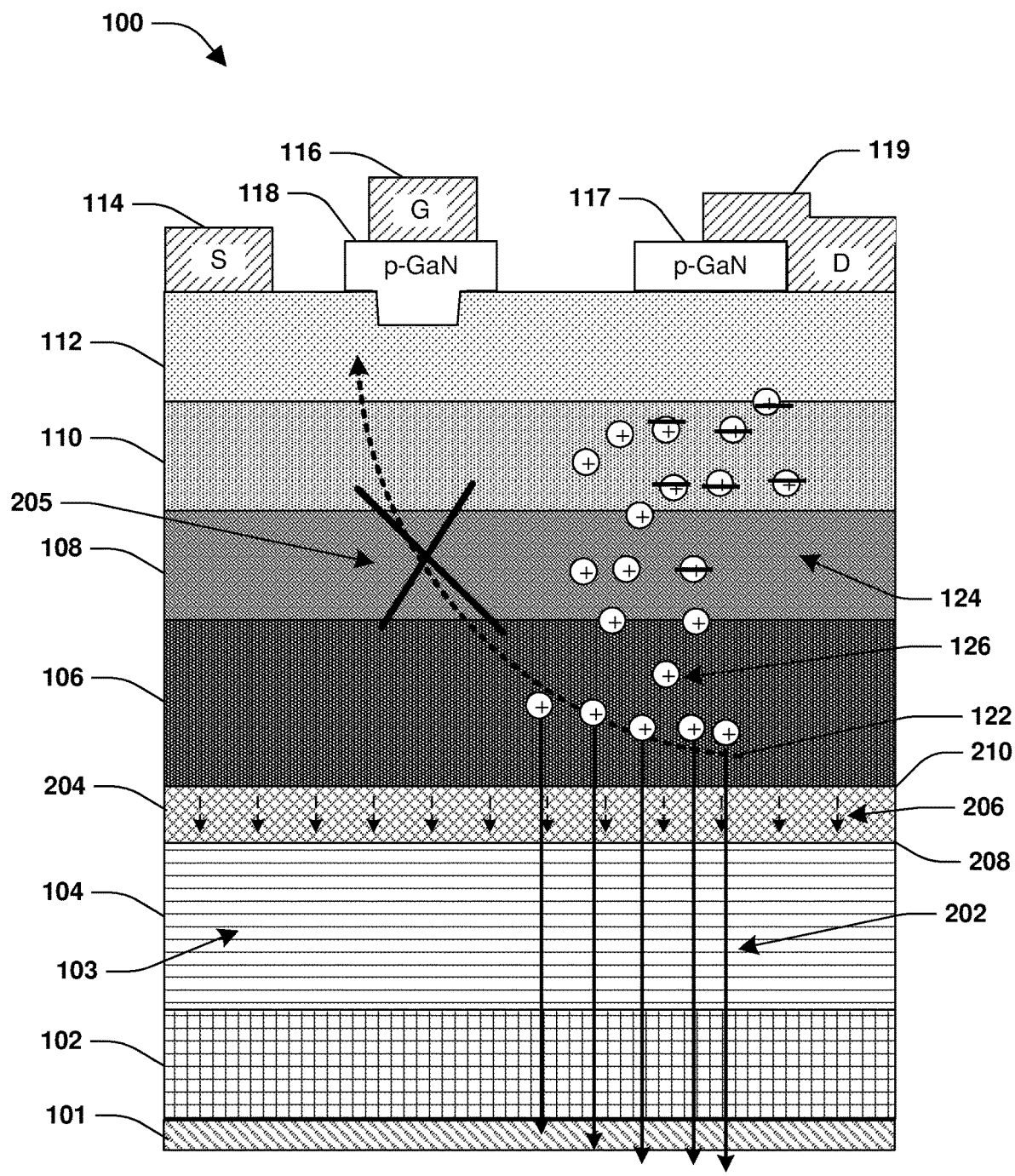
FIG. 2 is an illustration of a semiconductor structure with a hole draining structure.

FIG. 2 illustrates a hole draining structure 204 formed underneath the third layer 106 such as underneath the p-type AlGaN layer. In some embodiments, the hole draining structure 204 is formed from a portion of the second layer 104, such as where the hole draining structure 204 is formed from a portion of the superlattice 103. In some embodiments, the hole draining structure 204 is formed between the third layer 106 and the second layer 104, and thus the hole draining structure 204 may be separate from the third layer 106 and the second layer 104 (e.g., the hole draining structure 204 is separate from and is not part of the superlattice 103). In some embodiments, the hole draining structure 204 comprises a concentration of metal material, such as aluminum, that is increasing towards the second layer 104 or towards a portion of the second layer 104 that is not used as the hole draining structure 204 (illustrated by arrows 206) and decreasing towards the third layer 106. In some embodiments, the hole draining structure 204 comprises a graded AlGaN layer having graded amount of aluminum content. In some embodiments, dimensions of the hole draining structure 204 depend upon a voltage rating of the semiconductor structure 100. In some embodiments, the hole draining structure 204 has a height between about 0.1 μm and about 1 μm. In some embodiments, the height of the hole draining structure 204 is less than 0.1 μm. In some embodiments, the height of the hole draining structure 204 is greater than 1 μm.

The second layer 104 may have a first concentration of metal material that is greater than a second concentration of metal material of the third layer 106. The hole draining structure 204 may comprise a third concentration of the metal material at a first interface 208 between the hole draining structure 204 and the second layer 104 or portion of the second layer 104 layer that is not used as the hole draining structure 204. The third concentration of the metal material of the hole draining structure 204 at the first interface 208 (e.g., 30% aluminum concentration) may be less than the first concentration of the metal material of the second layer 104 (e.g., 34% aluminum concentration of the superlattice 103) and greater than the second concentration of the metal material of the third layer 106 (e.g., 3% aluminum concentration of the p-type AlGaN layer).

The hole draining structure 204 may comprise a fourth concentration of the metal material at a second interface 210 between the hole draining structure 204 and the third layer 106. The fourth concentration of the metal material of the hole draining structure 204 at the second interface 210 (e.g., 12% aluminum) may be less than the first concentration of the metal material of the second layer 104 (e.g., 34% aluminum concentration of the superlattice 103) and less the third concentration of the metal material of the hole draining structure 204 near the first interface 208 (e.g., 30% aluminum concentration). The fourth concentration of the metal material of the hole draining structure 204 at the second interface 210 (e.g., 12% aluminum) may be greater than the second concentration of the metal material of the third layer 106 (e.g., 3% aluminum concentration of the p-type AlGaN layer). In some embodiments, the hole draining structure 204 comprises a graded concentration of the metal material.

The hole draining structure 204 provides a hole draining path 202 through which the holes 216 may drain from the third layer 106 down through the hole draining path 202 and down through the second layer 104 towards the substrate 101. This is because the hole draining structure 204 reduces the otherwise large valence band discontinuity that would otherwise exist if there was no hole draining structure 204 between the second layer 104 and the third layer 160. In particular, the hole draining structure 204 comprises concentrations that the metal material that provide less of a valence band gap offsets at the interfaces 208 and 210 than the abrupt and large valence band offset that would otherwise exist between the second layer 104 and the third layer 106 if there was no hole draining structure 204. In some embodiments, if the metal material concentration of the hole draining structure is about 12% near the second interface 210, then a valence band-offset at the second interface 210 may be reduced to about 63.5 meV as opposed to about 287 meV if there was no hole draining structure 204 between the second layer 104 and the third layer 106. If the metal material concentration of the hole draining structure is about 30% near the first interface 208, then a valence band-offset at the first interface 208 may be reduced to about 47.8 meV as opposed to about 287 meV if there was no hole draining structure 204 between the second layer 104 and the third layer 106. The smaller the valence band-offset at the interface between layers, the less resistance/barrier there is for the holes 126 to travel through the interfaces, thus the holes will no longer accumulate at the interfaces.

The smaller valence band-offsets at the interfaces 208 and 210 is because there is no abrupt and large changes in concentration of the metal material along the hole draining path 202 that would otherwise be the case if there was no hole draining structure 204. Without the hole draining structure 204 there would be a large difference in concentrations of the metal material between the second layer 104 and the third layer 106. Because the holes 126 will travel along the hole draining path 202 towards the substrate 101, the holes 126 may no longer travel 205 towards the gate 116, which could otherwise result in an accumulation of holes at the gate 116 that could damage the semiconductor structure 100 and/or degrade performance of the semiconductor structure 100.

Figure 3:
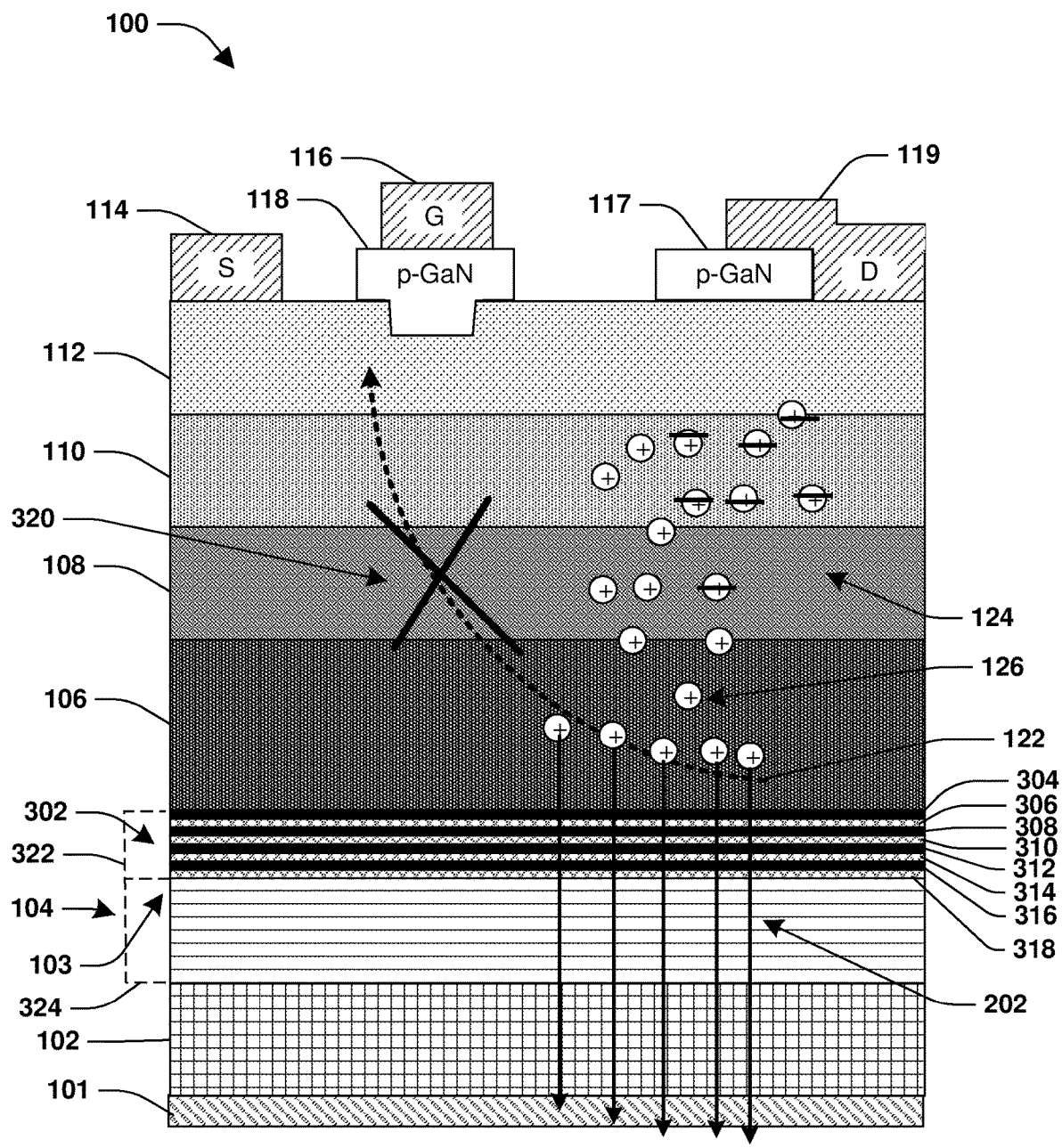
FIG. 3 is an illustration of a semiconductor structure with a hole draining structure formed within a first portion of a superlattice.

FIG. 3 illustrates a hole draining structure 302 formed underneath the third layer 106 such as underneath the p-type AlGaN layer. In some embodiments, a first portion of the second layer 104 (illustrated by dashed lines 322) comprises the hole draining structure 302 that is formed over a second portion of the second layer 104 (illustrated by dashed lines 324). The hole draining structure 302 may comprise a first plurality of layers, such as a layer 304, a layer 308, a layer 312, a layer 316, and/or any other number of layers. It may be appreciated that the first plurality of layers may comprise any number of layers. The hole draining structure 302 may comprise a second plurality of layers, such as a layer 306, a layer 310, a layer 314, a layer 318, and/or any other number of layers. It may be appreciated that the second plurality of layers may comprise any number of layers. The first plurality of layers are interleaved with the second plurality of layers. In some embodiments, a concentration of aluminum content within the first plurality of layers and/or the second plurality of layers may increase towards the superlattice 103.

In some embodiments, the first plurality of layers and the second plurality of layers are formed from layers of the superlattice 103.

The second plurality of layers comprises increasing concentrations of the metal material towards the second portion of the second layer 104 and decreasing concentrations of the metal material towards the third layer 106. Each layer of the second plurality of layers going towards the second layer 104 may have a certain % increase in metal material in relation to a prior layer (e.g., the layer 310 may have 4% more metal material than layer 306, layer 314 may have 4% more metal material than layer 310, etc.). In some embodiments, the first plurality of layers comprise an AlGaN material with differing amounts of aluminum per layer.

In some embodiments, the first plurality of layers do not comprise the metal material. In some embodiments, the first plurality of layers may comprise gallium nitride (GaN) material. In some embodiments, the first plurality of layers comprises a layer such as the layer 304 that excludes the metal material (or any number of layers of the first plurality of layers), and other layers of the first plurality of layers, such as the layer 308, the layer 312, the layer 316, etc., comprise increasing concentrations of the metal material towards the second portion of the second layer 104 and decreasing concentrations of the metal material towards the third layer 106.

In some embodiments, the number of layers within the first plurality of layers is greater than or equal to 3 layers, such as 8 layers. In some embodiments, the number of layers within the second plurality of layers is greater than or equal to 3 layers, such as 8 layers. If there are 8 layers in the first plurality of layers and 8 layers in the second plurality of layers, then the aluminum concentration may change by about 4% or any other percent change per layer of the second plurality of layers, in some embodiments.

The hole draining structure 302 forms a hole draining path 202 through which the holes 126 may travel towards the substrate 101. Because the holes 126 will travel along the hole draining path 202 towards the substrate 101, the holes 126 may no longer travel 320 towards the gate 116, which could otherwise result in an accumulation of holes at the gate 116 that could damage the semiconductor structure 100 and/or degrade performance of the semiconductor structure 100.

Figure 4:
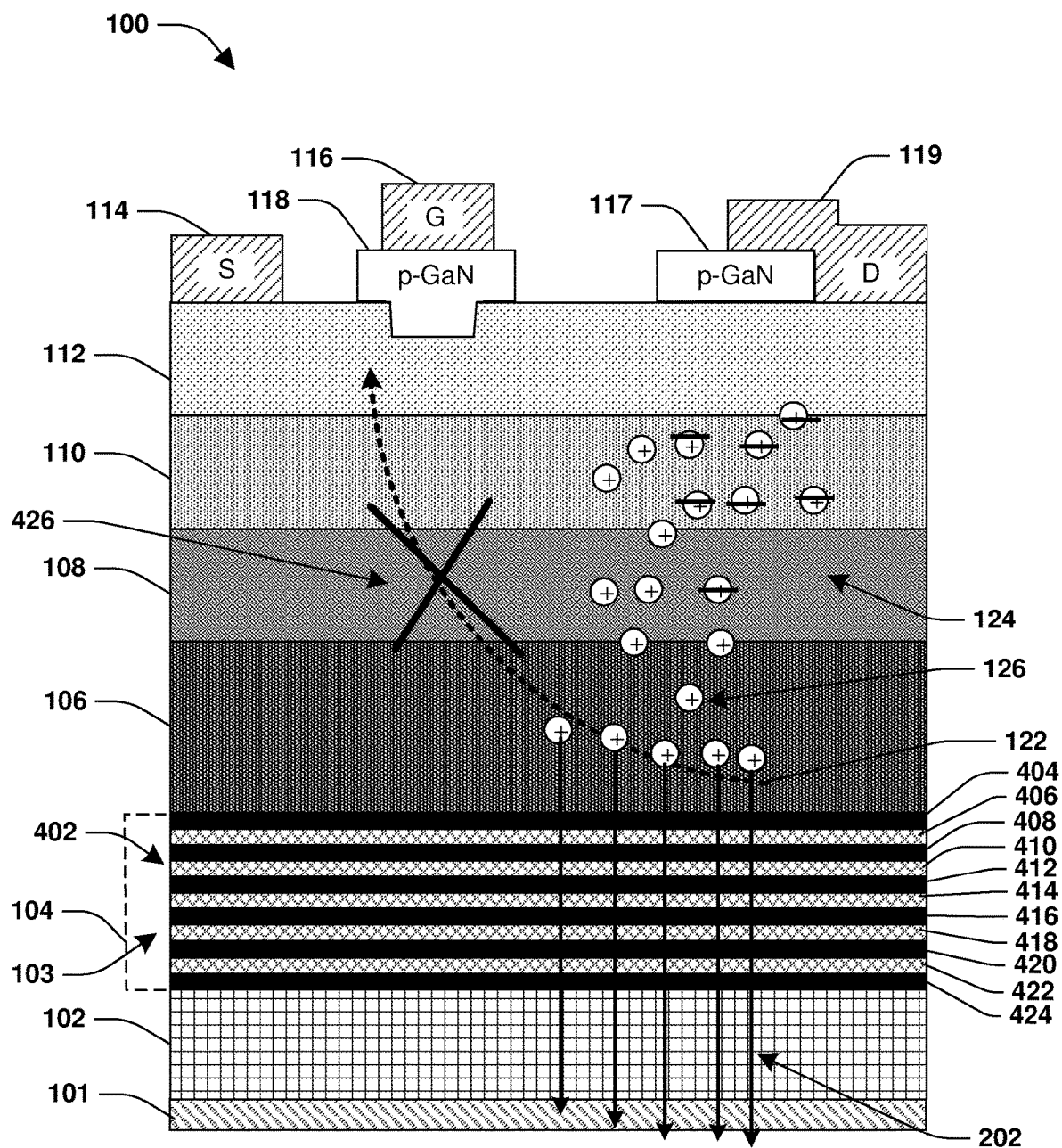
FIG. 4 is an illustration of a semiconductor structure with a hole draining structure formed within a superlattice.

FIG. 4 illustrates a hole draining structure 402 formed underneath the third layer 106 such as underneath the p-type AlGaN layer. The hole draining structure 402 may be formed from the superlattice 103 of the second layer 104. In some embodiments, the entire superlattice 103 is used as the hole draining structure 402. The hole draining structure 402 may comprise a first plurality of layers, such as a layer 404, a layer 408, a layer 412, a layer 416, a layer 420, layer 424, and/or any other number of layers. It may be appreciated that the first plurality of layers may comprise any number of layers. The hole draining structure 402 may comprise a second plurality of layers, such as a layer 406, a layer 410, a layer 414, a layer 418, a layer 422, and/or any other number of layers. It may be appreciated that the second plurality of layers may comprise any number of layers. The first plurality of layers are interleaved with the second plurality of layers. In some embodiments, a concentration of aluminum content within the first plurality of layers and/or the second plurality of layers may increase towards the first layer 102.

In some embodiments, the first plurality of layers exclude the metal material, such as where the first plurality of layers comprise GaN or other material. In some embodiments, the layer 404 of the first plurality of layers (or any number of layers of the first plurality of layers) excludes the metal material, while other layers of the first plurality of layers such as the layer 408, the layer 412, the layer 416, the layer 420, and the layer 424, have increasing concentrations of the metal material going towards the first layer 102 and decreasing concentrations of the metal material going towards the third layer 106. For example, each layer going from layer 408 down to layer 424 may have a certain percentage increase in aluminum content, such a 0.4% increase, a 4% increase, or any other percentage increase, which may be based upon how many layers are in the first plurality of layers.

In some embodiments, the second plurality of layers may comprise increasing concentrations of the metal material going towards the first layer 102 and decreasing concentrations of the metal material going towards the third layer 106. In some embodiments, the second plurality of layers comprise an AlGaN material. For example, each layer going from layer 406 down to layer 422 may have a certain percentage increase in aluminum content, such a 0.4% increase, a 4% increase, or any other percentage increase, which may be based upon how many layers are in the second plurality of layers.

In some embodiments, a first set of layers of the second plurality of layers may comprise a first concentration of the metal material. For example, if the first plurality of layers comprises 90 layers, then the first set of layers may comprise layers 1-10 having the first concentration of the metal material. A second set of layers of the second plurality of layers, such as layers 11-20, may have a second concentration of the metal material, such as a concentration that is 3% more than the first concentration or any other percentage more than the first concentration. A third set of layers of the second plurality of layers, such as layers 21-30, may have a third concentration of the metal material, such as a concentration that is 3% more than the second concentration or any other percentage more than the second concentration. In this way, the second plurality of layers may have a step-like graded increase in the metal concentration. In some embodiments, one or more sets of layers of the first plurality of layers may also have a step-like graded increase in the metal concentration. In some embodiments, a first set of layers of the first plurality of layers (e.g., layers closer to the third layer 106) may exclude the metal material, while other sets of layers of the first plurality of layers may comprise the step-like graded increase in the metal concentration towards the first layer 102.

The hole draining structure 402 forms a hole draining path 202 through which the holes 126 may travel towards the substrate 101. Because the holes 126 will travel along the hole draining path 202 towards the substrate 101, the holes 126 may no longer travel 426 towards the gate 116, which could otherwise result in an accumulation of holes at the gate 116 that could damage the semiconductor structure 100 and/or degrade performance of the semiconductor structure 100.

Figure 5:
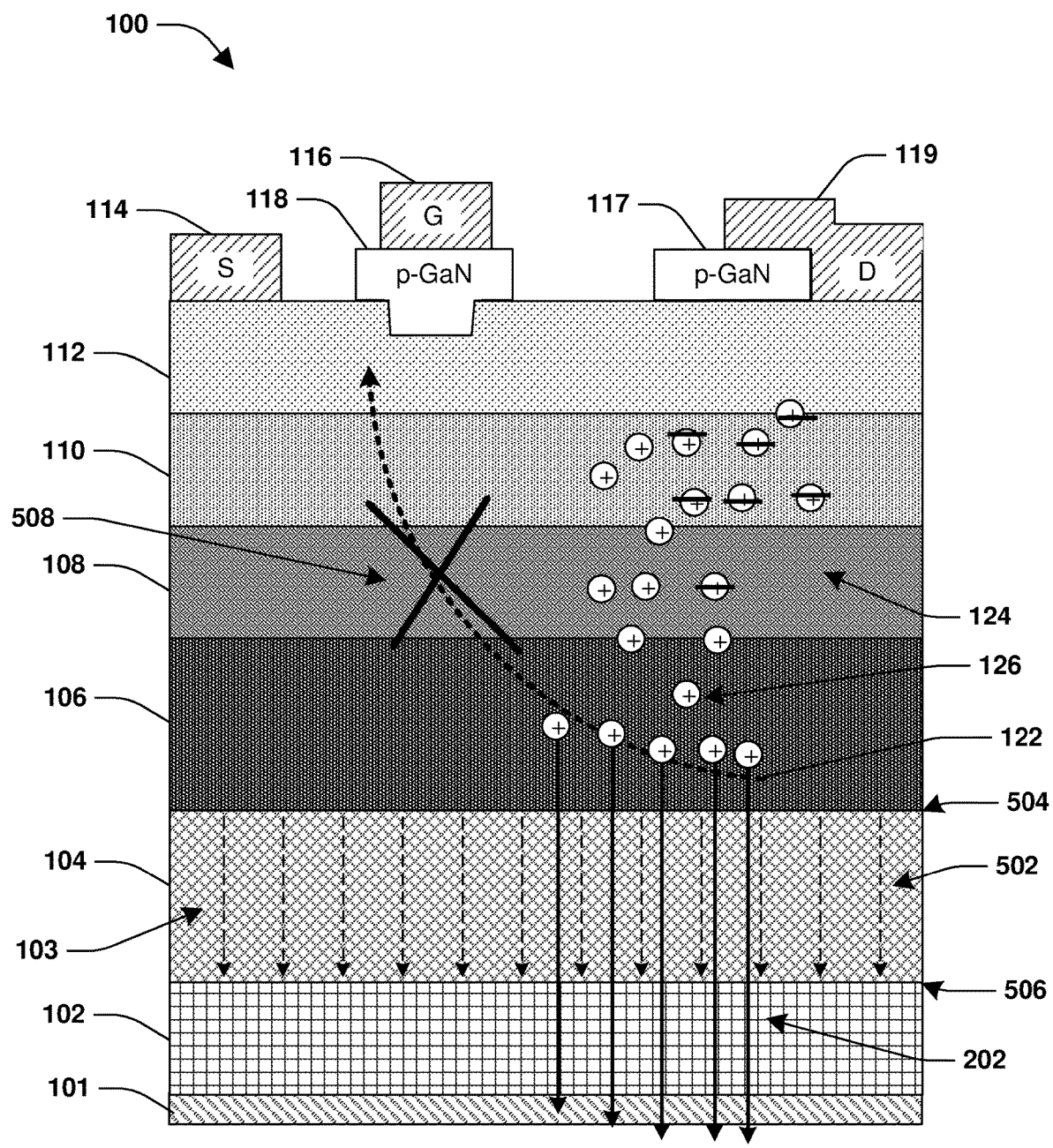
FIG. 5 is an illustration of a semiconductor structure with a hole draining structure formed within a superlattice with a graded concentration of metal material.

FIG. 5 illustrates a hole draining structure 502 formed underneath the third layer 106 such as underneath the p-type AlGaN layer. The hole draining structure 502 may be formed from the superlattice 103 of the second layer 104. In some embodiments, the entire superlattice 103 is used as the hole draining structure 502. In some embodiments, the entire superlattice 103 is formed as the hole draining structure 502 with an increasing graded concentration of the metal material towards a first interface 506 between the superlattice 103 and the first layer 102, and with a decreasing graded concentration of the metal material towards a second interface 504 between the superlattice 103 and the third layer 106.

The hole draining structure 502 forms a hole draining path 202 through which the holes 126 may travel towards the substrate 101. Because the holes 126 will travel along the hole draining path 202 towards the substrate 101, the holes 126 may no longer travel 508 towards the gate 116, which could otherwise result in an accumulation of holes at the gate 116 that could damage the semiconductor structure 100 and/or degrade performance of the semiconductor structure 100.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A semiconductor structure, comprising:
a substrate;
a first layer formed over the substrate;
a superlattice formed on the first layer;
a hole draining structure that is either formed in an upper part of the superlattice or forms a separate layer above the superlattice;
a p-type aluminum gallium nitride layer formed on the hole draining structure;
a channel layer over the p-type aluminum gallium nitride layer,
wherein the superlattice comprises a first set of layers having a first material type and a second set of layers having a second material type, wherein the first set of layers is interleaved with the second set of layers,
wherein the superlattice below the hole draining structure has an effective first concentration of metal material throughout a thickness of the superlattice below the hole draining structure, the effective first concentration being less than a concentration of metal material in the first layer,
wherein the p-type aluminum gallium nitride layer comprises a second concentration of the metal material that is less than the effective first concentration,
wherein the hole draining structure has an effective graded concentration of the metal material that decreases moving from a first interface between the hole draining structure and the superlattice below the hole draining structure to a second interface between the hole draining structure and the p-type aluminum gallium nitride layer,
wherein the hole draining structure has a third concentration of the metal material at the first interface and a fourth concentration of the metal material at the second interface,
wherein the third concentration is greater than the second concentration of the metal material and less than the effective first concentration of the metal material, and
wherein the fourth concentration of the metal material is greater than the second concentration of the metal material, less than the effective first concentration of the metal material, and less than the third concentration of the metal material.

2. The semiconductor structure of claim 1, wherein the hole draining structure forms a separate layer above the superlattice.

3. The semiconductor structure of claim 1, wherein the hole draining structure provides a hole draining path to drain holes injected into the semiconductor structure towards the substrate.

4. The semiconductor structure of claim 3, wherein the hole draining path drains the holes away from a gate of the semiconductor structure.

5. The semiconductor structure of claim 1, wherein the superlattice and the hole draining structure comprises aluminum gallium nitride, the metal material comprises aluminum, and the channel layer comprises gallium nitride.

* * * * *